United States Patent [19]
Watanabe et al.

[11] Patent Number: 5,825,789
[45] Date of Patent: Oct. 20, 1998

[54] PROCESS FOR PRODUCING A RESONATOR IN A SEMICONDUCTOR LASER DEVICE

[75] Inventors: Yoshiaki Watanabe; Satoshi Miyaguchi, both of Tsurugashima; Hiroshi Amano; Isamu Akasaki, both of Nagoya, all of Japan

[73] Assignee: Pioneer Electric Corporation, Tokyo, Japan

[21] Appl. No.: 577,620

[22] Filed: Dec. 22, 1995

[30] Foreign Application Priority Data

Dec. 22, 1994 [JP] Japan ................................. 6-320132

[51] Int. Cl.$^6$ .............................. H01S 3/10; H01S 3/083
[52] U.S. Cl. ................................................. 372/21; 372/94
[58] Field of Search ........................................ 372/21, 94

[56] References Cited

U.S. PATENT DOCUMENTS

| | | | |
|---|---|---|---|
| 4,592,043 | 5/1986 | Williams | 370/3 |
| 5,377,285 | 12/1994 | Podgorski | 385/27 |
| 5,545,359 | 8/1996 | Ackley et al. | 264/1.23 |
| 5,566,251 | 10/1996 | Hall et al. | 385/27 |

Primary Examiner—C. H. Kelly
Attorney, Agent, or Firm—Fish & Richardson, PC

[57] ABSTRACT

A method for forming a resonator in a semiconductor laser device comprises the steps of; filling with a resin a gap surrounding the side surfaces of the waveguide for a resonator other than the end-surface to be polished; polishing the end-surface and the resin surrounding it; forming a predetermined optical coating on the polished end-surface and the resin in the state of the laser waveguide and the electrode being embedded; and removing the embedding resin. Both the bending of polished end-surfaces and the entering of the thin film into the side surface of the laser waveguide is prevented so that a high smooth end-surface of mirror coating for resonator is achieved. Furthermore, any crystals are used for a substrate carrying a semiconductor laser structure with a resonator even if that crystal is of non-cleavage, according to that method.

6 Claims, 5 Drawing Sheets

PROCESS FOR PRODUCING A RESONATOR IN A SEMICONDUCTOR LASER DEVICE

BACKGROUND OF THE INVENTION

1. Field of the Invention

The present invention relates to a method for forming a semiconductor laser device and, particularly to a process for producing a resonator in the semiconductor laser device.

2. Description of the Related Art

The semiconductor laser device usually has the resonator in which a pair of planes is cleaved perpendicular to the plane of a junction such as p-n of semiconductor crystal layers of different electronic properties. A semiconductor laser device with stripe contact is generally manufactured as follows: semiconductor crystal layers including a junction are epitaxial-grown on a washed major face of a crystal substrate with an electrode at the back face by using a chemical vapor deposition method, particularly a method of metalorganic compound chemical vapor deposition (MOCVD), molecular beam epitaxy (MBE) or the like. A laser waveguide structure is formed as a multiple layer of crystal layers by using an etching method. A strip electrode is formed on the waveguide structure. After that, a resonator consisting of a pair of planes at both ends of the waveguide of the semiconductor laser structure on the substrate is usually formed by the cleavage of crystal of the substrate or a multi-layer crystal thereon. Finally, a protective layer is formed on the resonator at the end-surfaces.

An epitaxial-grown GaAs crystal used for the semiconductor laser device or a GaAs wafer for the substrate has a cleavage. This cleavage nature is utilized for forming the resonator in such a manner that straight lines of grooves are carved to the wafer at a predetermined interval of resonance length or cavity length and thus, the wafer is cleaved along the grooves into bar chips by application of a stress. Therefore, wafer's cleavage facilitates to form at a high accuracy of an atomic level the cleaved planes parallel to each other in a process for forming the resonator for the laser structure on the GaAs wafer.

Whereas, there is an attempt to use GaN materials having a wide band-gap, e.g., 3.4 eV for a semiconductor laser device such as a light emitting diode or LED.

However, there are at least two problems in the use of GaN materials for the semiconductor laser device.

(1) It is difficult to form the very minute structure such a semiconductor laser or waveguide element on the GaN material substrate, since GaN is of a high chemical stability and durability against a wet or dry etching and having a high rigidity. This invites a drawback of difficulty to form the semiconductor laser structure on the GaN material substrate by a lithography or etching.

(2) A sapphire substrate is well used for forming thin films of GaN materials to obtain a lattice matching therebetween and to prevent from a defect. However, the sapphire substrate is not of clear cleavage. Therefore, it is difficult to form the resonator of a pair of facing mirrors on the sapphire substrate by using its cleavage.

In this way, the prior forming process of making the resonator by using the cleavage nature is restricted in that both the substrate and the epitaxial-grown crystal thereon have cleavage at the same time and both the cleaved directions of the substrate and the epitaxial-grown crystal thereon coincide with each other. Other than this condition, any resonator structure is not constructed by cleavage. The sapphire substrate is preferably selected from various substrates used for the GaN semiconductor laser since the quality of the epitaxial-grown crystal formed on the sapphire substrate is best. The use of substrate other than the sapphire is in the negative at present.

SUMMARY OF THE INVENTION

Therefore, it is an object of the present invention to provide a new method of preparing an optical resonator in a semiconductor laser device without using cleavage of both the substrate material, e.g., sapphire and the crystal of the semiconductor laser structure, e.g., GaN.

In accordance with a first aspect of the present invention, a method for preparing an optical resonator for a semiconductor laser device comprises the steps of: embedding in an uncured resin a semiconductor laser structure having end-surfaces to be a resonator formed on a substrate and curing said resin to protect the structure; lapping and polishing said end-surfaces and parts of said cured resin thereon; forming thin films on the polished end-surfaces; and removing said cured resin.

In accordance with a second aspect of the present invention, a method for preparing an optical resonator in a semiconductor laser device comprises the steps of: embedding in an uncured resin a semiconductor laser structure having end-surfaces to be a resonator formed on a substrate in such a manner that the substrate is put between a pair of dummy substrates having the same size as the substrate to be sandwiched therebetween; curing said resin to protect the structure so as to make a piled lamination of the dummy substrates and substrate; lapping and polishing said end-surfaces and parts of said cured resin thereon together with side surfaces of the dummy substrates in the piled lamination; forming thin films on the polished end-surfaces; and removing said cured resin and said dummy substrates.

In these methods for preparing the optical resonator, said end-surfaces are formed in such a manner that said semiconductor laser structure in which a laser light propagates is cut substantially perpendicular to an extending direction of the propagation of the laser light by means of a cutting machine so as to make a pair of parallel end-surfaces.

In the first method for preparing the optical resonator, said embedding step to protect the structure includes a piling process of piling a plurality of the substrates each having the same size while each semiconductor laser structure is embedded in said uncured resin.

In the second method for preparing the optical resonator, said embedding step to pile the substrate and the dummy substrates includes a piling process of piling a plurality of the substrates each having the same size while each semiconductor laser structures is embedded in said uncured resin and sandwiched the piled substrates between the pair of said dummy substrates.

According to the present invention, both the side surfaces of the laser waveguide and the electrodes are embedded within the resin excepting end-surfaces thereof to be polished for a resonator, so that predetermined optical coatings of thin films are formed on these end-surfaces surrounded and embedded by the resin, after lapping and polishing them. As a result of removing the embedding resin, mirror coatings at end-surfaces can be formed without the coating bending round edges of the laser waveguide and over the side thereof. Furthermore, a resonator can be formed without respect to cleavage of the substrate crystal.

Other and further features, advantages and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

DETAILED DESCRIPTION OF THE PREFERRED EMBODIMENTS

A preferred embodiment of the present invention will be described hereinafter in detail in reference to the accompanying drawings.

There is prepared a wafer substrate of sapphire or the like with laser waveguides formed thereon each having an electrode strip being patterned so as to extend along the waveguide, the strip being used for injecting an electrical current into the semiconductor laser to be formed.

Figure 1:
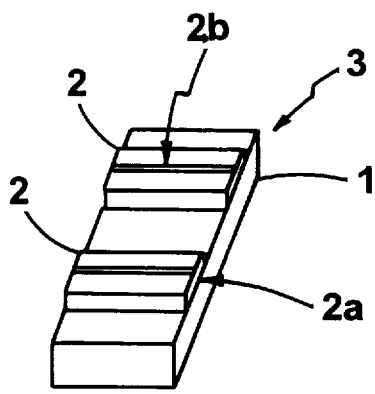
FIG. 1 is an enlarged perspective view of a portion of a bar chip for a semiconductor laser device in the process for forming a resonator according to the present invention.

The wafer with laser waveguides and electrode strips is cut into a plurality of bar chips by a cutting machine such as a dicing machine. As shown in FIG. 1, each bar chip 3 of 10×1×0.3 mm$^3$ is obtained from the wafer in which a plurality of the laser waveguide structures 2 are arranged in an array status on a substrate 1. The dicing machine is adjusted to the cutting angle in such a manner that the electrode strip or an extending direction of the waveguide in which a laser light propagates is perpendicular to the cut surface of the waveguide. Thus, end-surfaces 2a are defined as cut surfaces to be a resonator. The angle accuracy of an electrode strip 2b perpendicular to the cut surfaces of the waveguide of end-surfaces 2a is approximately 0.01 degree with respect to the right angle. The angle accuracy depends on the performance of the dicing machine and thus such accuracy is obtained easily.

Next, the bar chip is taken out of the support of the dicing machine and then washed. In the washed process, a suitable organic solvent and a cleaning reagent are used to remove uncleanness of a wax or adhesive used for supporting the bar chip onto the support.

Whereas, dummy substrates are cut at the same size of the bar chip. The material of the dummy substrate is a material with a polishing rate as substantially the same as that of said substrate wafer and said laser waveguide such as sapphire or ceramics.

Figure 2:
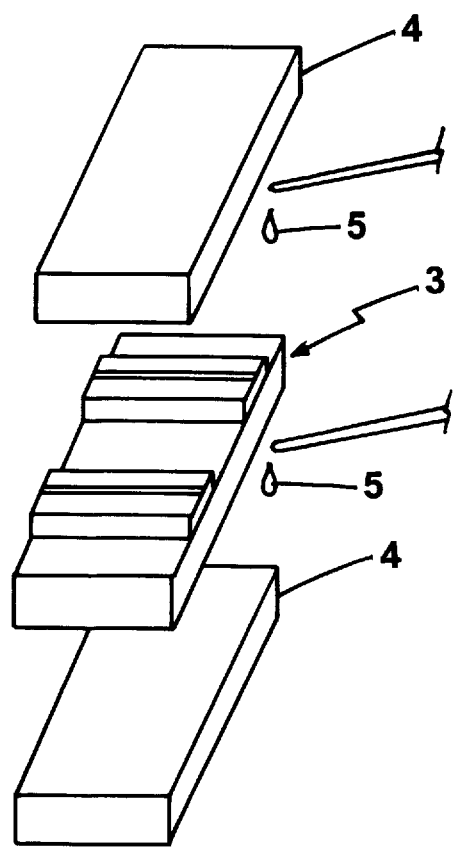
FIGS. 2 to 7 are enlarged perspective views each showing a bar chip or an integration of a dummy substrate and a bar chip for a semiconductor laser device in the process for forming a resonator according to the present invention, in which FIG. 5 further showing a lapping machine and FIG. 7 further showing a solvent bath the integration being immersed.
Figure 3:
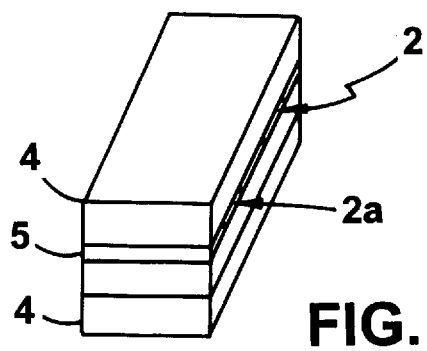

As shown in FIG. 2, the bar chip 3 is placed between a pair of the dummy substrates 4 and then an uncured resin 5 is provided between the dummy substrate 4 and the bar chip 3. After that the dummy substrates 4 and the bar chip 3 are adhesived in such a manner that the semiconductor laser structure having electrodes is embedded in the uncured resin while the end-surfaces 2a for a resonator of the semiconductor laser structure is exposed at the equal level of the side surfaces of the dummy substrate as shown in FIG. 3. The semiconductor laser structure is surrounded and embedded other than the end-surfaces by the uncured resin. As shown in FIG. 3, the laser waveguide and the electrode strip formed at the top face of the bar chip are abutted via the resin to the dummy substrate so that the dummy substrate 4 and the bar chip 3 are integrated into one piece. It is preferable that the bar chip is protected by sandwiching between the dummy substrates 4 at the top and back face of the bar chip by using the uncured resin of adhesives.

The uncured resin 5 is selected from adhesives such as rubbers, epoxys, acrylics or the like and a thermosetting resins and plastic materials or resins such as a wax and an optical curing resin including a photoresist, which are of nature in that a liquid resin is cured to a solid resin by means of drying, heading, irradiating or the like. There is preferably used a resin with a high cured stiffness but lower than the stiffness of the semiconductor crystal and the electrode, because it presses and covers the semiconductor crystal and the electrode which should be protected from the resin without any damage. There is preferably used a resin with a low viscosity and a high wetting property for the bar chip at an uncured status. When using an uncured resin in the form of a solution, the preferably used solvent is a detergent of non-phosphorus such as acetone, ethanol, IPA, trichlene or the like usually used in the semiconductor process as concerning the device cleaning in addition to remove the unused resin on the bar chip. The cured resin may be removed by means of an ultrasonic cleaner in which the integrated piece of the dummy substrate and the bar chip is immersed on the container and heated and vibrated so that the cured resin is removed into the solvent. In this way, the preferably used resin is a so-called BA reagent comprising methyl methacrylate (a major component) and N, N dimethyl toluidine (a solvent). The BA reagent has the above requirements of cured stiffness, viscosity and wetting property and insoluble durability against a polishing liquid but a pertinent solubility to a final cleaning reagent. This BA reagent has an useful properties for good adhesiveness to the bar chip and the high curing speed and a good solubility to acetone.

Since the back face of any bar chip is a flat surface, the top face of the bar chip may be contacted via the resin to the back face of another bar chip and thus a plurality of the bar chips may be piled in turn so as to be an integrated one piece. That is, there is performed a piling process of piling a plurality of the bar chips each having the same size.

Furthermore, a pair of the dummy substrates may sandwich the piled bar chips. By these, a plurality of the bar chips may be lapped and polished in one polishing process.

Figure 4:
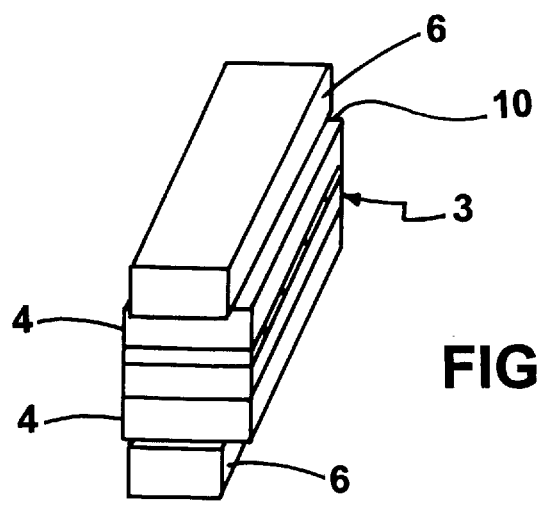

Next, the uncured resin is cured as it is. The dummy substrate and the bar chip are integrated to one piece. The integrated piece of the dummy substrate 4 and the bar chip 3 is polished by a polishing or lapping device as follows:

As shown in FIG. 4, the integrated piece of the dummy substrate 4 and the bar chip 3 is supported between a pair of polishing dampers 6 for the polishing device having a rotation polishing plate so that the end-surfaces 2a to be polished of the integrated piece contacts to the surface of the rotation polishing plate and then the laser waveguide 2 and the electrode strip 2b are abutted and fixed vertical to the rotation polishing plate. A portion 10 of the integrated piece to be lapped and lapped is projected from the edges of the polishing dampers 6 so that the dummy substrate 4 and the bar chip 3 is fixed as shown in FIG. 4. The polishing device includes a fixing mechanism supporting and actuating the polishing clampers 6 together with the integrated piece (not shown).

Figure 5:
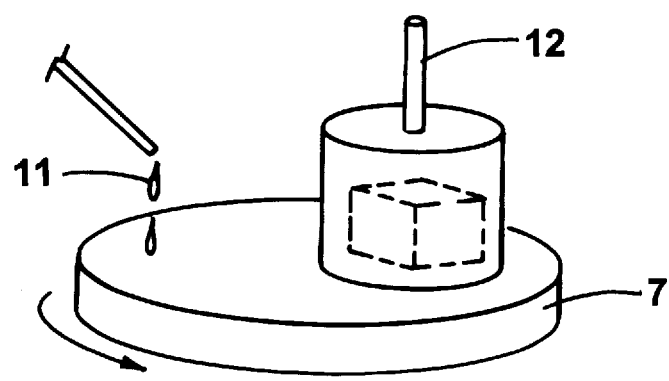

The rotation polishing plate 7 of the polishing device of FIG. 5 comprises a flat turn table made of a metal such as Fe, Cu, Sn, stainless steel or the like or the alloy thereof and a fabric sheet formed on the table made of synthesized or composite materials such as nylon, acrylic or the like.

A preliminary polishing process is performed in such a manner that the portion 10 of the integrated piece with the bar chip is roughly lapped to be a flat surface contacted to the optical polishing plate by means of a polishing sheet, a polishing stone or the like. Since the dummy substrates are adhesived by the cured resin 5 to the top and back faces of the bar chip, the damage of the bar chip is avoided from the stress of the warp from the polishing dampers 6 during the attachment of the bar chip 3. The dummy substrates further prevent non-uniformity of pressure caused by a thickness difference between the selectively epitaxial-grown portions in the laser waveguide structure 2 from damaging the bar chip.

As shown in FIG. 5, the end-surfaces 2a is put on the flat polishing plate 7 and then the integrated piece shown in a dot line is moved over the plate 7 on which the polishing liquid abrasive 11 has been poured to obtain a flat polished surface of the projection portion 10 or to reduce the thickness with controlled amount. The polishing liquid abrasive 11 consists of fine abrasive inorganic particles (an average diameter is 10 micro meters or less) such as diamond, alumina, silicon carbide, ceramics or the like and a liquid such as water suspending the particles in the form of dispersion. This polishing liquid further may contain a lubricating oil and/or an interfacial active agent which does not influence the embedding resin.

During the rotation of the plate, the polishing clampers is suppressed downward by a weight so the polished portion 10 of the bar chip is loaded to the plate 7 and the integrated piece is maintained at a stationary position of the plate against the rotation thereof. The polishing device comprises a self rotatable mechanism 12 driven by a speed difference between the outer and inner circumferences of the plate which allows the polishing dampers to rotate on its axis. Moreover, the polishing device may include a swing mechanism which moves the polishing dampers in the radius direction of the plate. The use of the self rotatable mechanism and the swing mechanism is useful for preventing from non-uniform wear of the polished portion and the plate.

When the plate contains an abrasive particles as a component, the process may be performed only by pouring water or an interfacial active agent solution similar to the above polishing process. In this case of avoiding water from the bar chip, it is possible to polish a bar chip by a pertinent liquid.

In the polishing process, the process time may be reduced by using at least two kinds of abrasive particles. Since sapphire and GaN have a high rigidity nearly to that of diamond, there are probably broken off a portion of the bar chip due to crash into the abrasive particle depending on its speed during the polishing process so that the polished end-surfaces of the semiconductor laser structure becomes rough. To avoid this problem, the polishing plate should be rotated at a very low speed to obtain a smooth flat surface. The rotation speed of the polishing plate is preferably set up at 150 cm/sec. or less as a relative speed for the polishing of a small area of the end-surface of the bar chip made of a rigid material such as GaN and sapphire. When using the abrasive particles in an abrasive diameter range 0.01 to tens micro meters, it is preferable to set a relative speed within 3 cm/sec. to 150 cm/sec.

Next, when the finishing touches are obtained as any lines disappearing in the surfaces of the bar chips by monitoring the polished end-surface 2a with an optical microscope (approximately magnification 200× to 1000×), then the polishing process is stopped. The bar chip is washed as it is. There is used the cleaning reagent having properties of non-melting and non-corrosion of the cured resin between the bar chip and the dummy substrate in the washing process. In this case, an ultrasonic cleaner may be used together with the cleaning reagent.

The polished end-surfaces are wiped by a clean cleaning cloth such as Bencot with the cleaning reagent to remove the uncleanness. It is preferable to monitor the cleaned end-surface to be a resonator by using an optical microscope.

Figure 9:
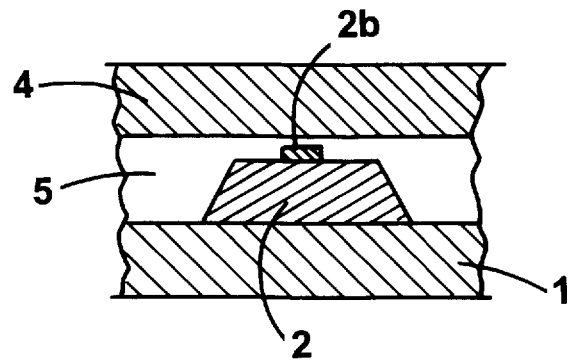
FIG. 9 is a partially enlarged end-surface view of the resonator for a semiconductor laser device in the process for forming a resonator according to the present invention.

FIG. 9 show the polished end-surface to be a resonator for the semiconductor laser device in the integrated piece after polishing process in which the end-surfaces 2a of the bar chip 3 sandwiched between the dummy substrates 4 is a mirror surface which is surrounded by the resin 5. As seen form the figure, there is filled with resin 5 in the gap between the dummy substrate 4 and the substrate 1 carrying the laser waveguide 2 and the electrode strip 2b.

The undulations of the embedding resin and the end-surfaces in the polished bar chip or the same plane thereof is within a sub-micron order. The bending of the end-surface round edges of the laser waveguide structure is not observed even with a SEM monitoring device. The smoothness of the polished surface at the active region of the semiconductor laser structure is obtained at a level of ½0 or low of the emission wavelength in the observation of a probe-contact roughness measurement device. By using the dummy substrates, the polished area is enlarged so that the verticality of the longitudinal direction of the bar chip to that of the electrode strip is obtained an angle level of 90 plus or minus 0.02 degree and the verticality of the laser waveguide to the polished surface is 90 plus or minus 0.5 degree. Since the active region of the semiconductor laser structure emitting light is positioned within several micro meters from the edge of the structure per se and, the bending of the end-surface near the edge must prevented, otherwise the efficient reflection of the end-surface of the active region is reduced. The present invention overcomes this the bending of the end-surface near the edge by using the dummy substrates sandwiching the bar chip.

Figure 6:
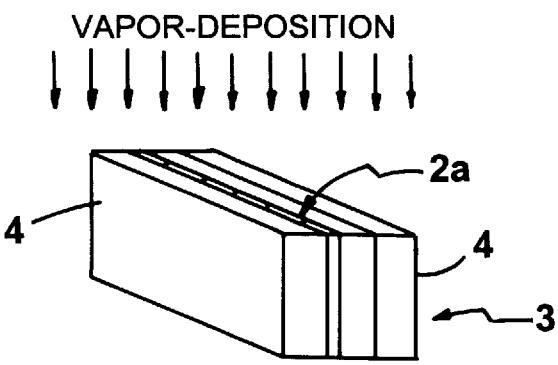

Next, as shown in FIG. 6, the end-surfaces 2a and resin surfaces are covered with an optical coating 13 such as a protection coating, a reflection coating or non-reflection coating by means of a vapor-depositing or sputtering method to protect the oxidization and the optical damage. Since the side surfaces of the laser waveguide vertical to the polished end-surface are covered with the BA reagent 5, the BA reagent or the cured resin prevents the optical coatings from invading the side surface of the semiconductor laser device. In this way, present invention perfectly overcomes the entry of the optical coatings on the side surface of the semiconductor laser device decreasing the emission property. Commonly used optical coating is a metal such as Al, Au or an oxides such as $SiO_2$, $TiO_2$.

Figure 7:
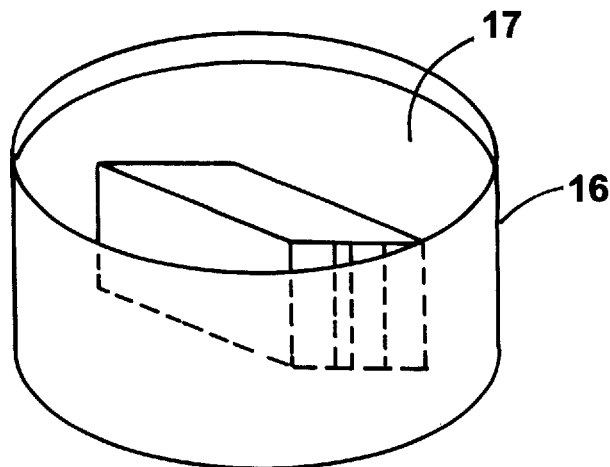

As shown in FIG. 7, the integrated piece including bar chip 3 sandwiched between the dummy substrate 4 is immersed into a predetermined solvent bath 16 accommodating an organic solvent 17 melting only the embedding resin surrounding the laser waveguide, so that the resin 5 is removed by melting and then the dummy substrates 4 are separated from the bar chip 3. When the BA reagent is used for the resin, acetone is used for the organic solvent. In this case, an ultrasonic cleaner may be used together with the organic solvent.

Figure 8:
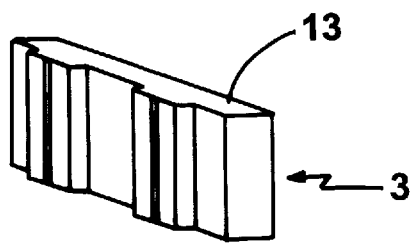
FIG. 8 is an enlarged perspective view of a portion of a bar chip for a semiconductor laser device after the polishing process in the method according to the present invention.

In this way, there is a bar chip carrying semiconductor laser devices with optical coatings 13 at both the end-surfaces after the mirror formation process, as shown in FIG. 8.

Both end-surfaces for the resonator are formed in the mirror formation process. The polishing dampers facilitate to invert up and down the polished surface of the integrated piece of the dummy substrates and the bar chip, since the clampers rotatably supports the integrated piece as shown in FIG. 4 so that the polished surfaces are positioned at both the ends projected without detaching operation. Therefore, one end-surface of the waveguide is covered with the coating, immediately after the rotation of the integrated piece, the other end-surface is processed.

The final cleaning process is performed after finishing the mirror formation process for the end-surfaces of the resonator in the semiconductor laser device.

In addition to the above method for forming a GaN semiconductor laser device, the present invention can be adapted to another semiconductor laser device or dielectric optical element with the pertinent conditions of materials.

In addition to the above method using dummy substrates, a resonator in a semiconductor laser device can be formed without using a dummy substrate. That is, a bar chip substrate carrying the semiconductor laser structure is embedded in the resin and then it cured, after that, there is formed an elastic material inner faces of the polishing dampers of the polishing device so as to directly clamp the embedded bar chip covered with the resin. In this way, the end-surfaces can be polished together with the cured resin. Alternately, a plurality of the bar chips is laminated to each other while the top face of the chip contacts to the back face of the other. In this way, the many of the end-surfaces can be polished at the same time. After the polishing process, an optical coating of thin film is formed on the polished end-surface similarly to the above embodiment and then the cured resin is removed, so that a resonator of the end-surfaces in a semiconductor laser device can be formed in the mirror formation process.

Comparative performance tests are preformed with respect to resonators in semiconductor laser devices of GaN obtained through the prior cleavage methods and the present invention's optical polishing method.

Figure 10:
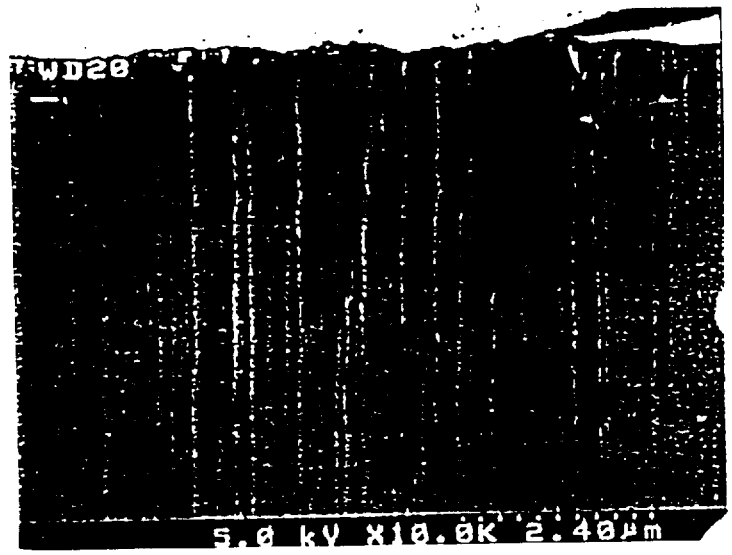
FIG. 10 is a microscope photograph with a predetermined magnification illustrating an end-surface of a resonator of a semiconductor laser device after a cleaving process.
Figure 11:
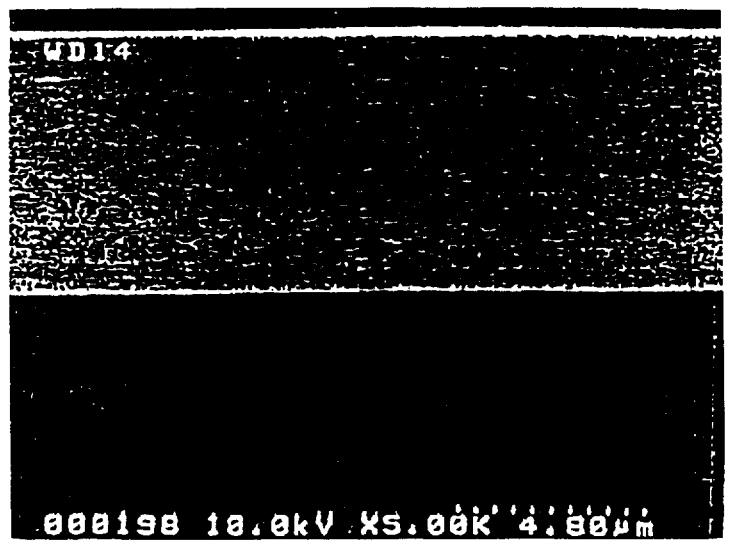
FIG. 11 is a microscope photograph with a predetermined magnification illustrating an end-surface of a resonator after the polishing process in the method according to the present invention.

The resonator end-surface formed by cleaving the wafer and the resonator end-surfaces formed by the present invention's optical polishing resonator end-surface are shown in FIG. 10 and FIG. 11 respectively. As seen from FIG. 10, many vertical lines appear at a constant interval as unevenness in the end-surface of the laser waveguide due to cleavage. This mirror face is insufficient to a resonator. On the other hand, as seen from FIG. 11, the mirror face according to the present invention is very smooth more than the former and functions as a resonator in the semiconductor laser.

In the measurement of smoothness with the roughness tester, the resonator end-surfaces obtained by an optical polishing according to the present invention has the average roughness of 33 Angstroms which is a level $1/10$ or less of a laser resonance wavelength. With respect to the size dimension accuracy in the resonator, the parallel discrepancy of a pair of the resonator mirrors is an angle 0.05 degree and the verticality of the resonator end-surface to the electrode strip is within an angle range plus or minus 0.3 degree to the right angle. These values suffices the requirement of the resonator. The verticality at the active region of the laser structure near to the edge of the polished end-surface is within plus or minus 0.5 degree to the right angle. Therefore, any decrease of efficient reflection does not occur.

Figure 12:
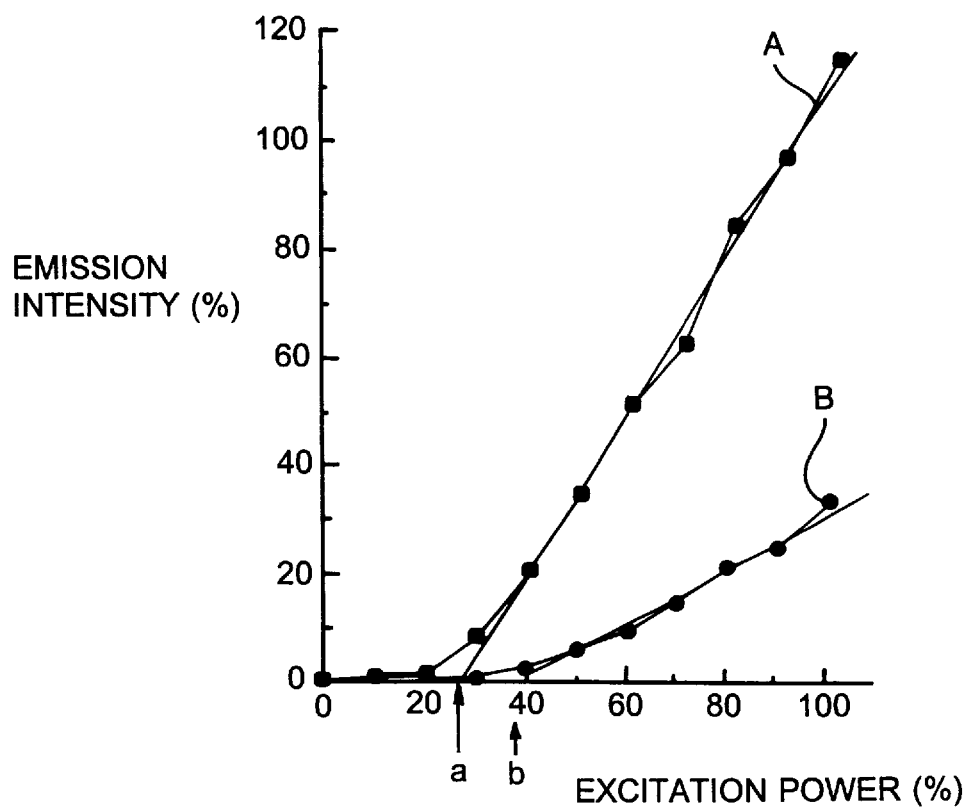
FIG. 12 is a graph plotted with outputs of emission intensities vs. optical excitation powers in GaN semiconductor laser devices having a resonator fabricated by using only cleavage of crystal and a resonator with a 90%–70% reflecting coating formed by using an optical polishing process of the present invention respectively.

Next, GaN semiconductor laser devices are formed from a wafer carrying the semiconductor laser structures ($Al_{0.2}Ga_{0.8}N/Ga_{0.9}In_{0.1}N$) each having a resonator fabricated by using only cleavage of its crystal in the prior art method. From the same wafer carrying the structure as the above, GaN semiconductor laser devices are formed each having a resonator with a 90%–70% reflecting coating formed by using an optical polishing process of the present invention. These semiconductor laser devices are compared with respect to the optical excitation power vs. the emission intensity. The results of the comparison are plotted in FIG. 12, which shows that the semiconductor laser (line A) having the resonator obtained by using the optical polishing according to the present invention has a low output threshold value lower than that of the cleaved semiconductor laser (line B). As seen from these plots, furthermore, the device according to the invention increases its output at a high efficiency more than that of the cleaved semiconductor laser. Furthermore, the threshold level a for line A of the device according to the invention is lower than the threshold b for line B of the cleaved semiconductor laser.

Whereas, if a plurality of the bar chips are piled each other without using the embedding resin, each bar chip carrying a step-like shape of epitaxial-grown laser waveguide structure allows a gap between the bar chips. Therefore, when an optical coating of thin film is formed on the end-surfaces of the laser waveguide then the optical coating goes through the gap into the side surfaces of the laser waveguide. This optical coating on the side surfaces gives some problems such as (1) the conductive entering coating gives a connection to the electrode so that the injected carriers enter through the coating resulting in a short circuits; (2) the entering coating makes it difficult to form a uniform thickness coating because of bending of the edge of the end-surface of the laser waveguide; and (3) the entering coating scatters light emitted from active region near the edge so as to decrease the coupling efficiency to an optical fiber for example. Particularly, when the optical coating is formed as a multi-layer form, the entering coating is serious in uniform thickness since a required thickness accuracy is very high level.

However, such an entering coating to the side surfaces is prevented since the end-surface and the embedding resin surrounding of the bar chip are lapped and polished at the same time and at substantially the same rate in the polishing process according to the present invention. Further, since the gap surrounding the laser waveguide is filled with the embedding resin according to the present invention, it prevents from bending of the edge of the end-surface of the laser waveguide.

In this way, the present invention can be adapted to almost resonator structure for the semiconductor laser device even if there is no cleavage in the structure such as the substrate and the laser structure crystal layers. Although it is difficult to form a resonator other than cleavage of crystal appearing in the epitaxial-growth layer and the substrate in the same cleaved direction, the present invention efficiently overcomes such a difficulty. Almost crystals currently usable for an emitting semiconductor materials are of cleavage, it is apparent that the selection of the material and combination is increased by the present invention.

For example, the substrate materials other that sapphire e.g. non-cleavage substrate such as IV group semiconductor materials, hexagonal system crystal e.g. SiC can be used. Generally, although a hexagonal system crystal substrate is not of cleavage, the present invention achieves that a low cleavage material such a hexagonal system crystal is used for the substrate of semiconductor laser devices with a resonator.

According to the present invention, a method for forming a resonator in a semiconductor laser device comprises the steps of filling with a resin a gap surrounding the side surfaces of the waveguide for a resonator other than the end-surface to be polished; polishing the end-surface and the resin surrounding it; forming a predetermined optical coating on the polished end-surface and the resin in the state of the laser waveguide and the electrode being embedded; and removing the embedding resin, whereby both the bending of polished end-surfaces and the entering of the thin film into the side surface of the laser waveguide is prevented so that a high smooth end-surface of mirror coating for resonator is achieved. Furthermore, any crystals are used for the substrate carrying semiconductor laser structures with resonators even if that crystal is of non-cleavage, according to the invention.

What is claimed is:

1. A method for preparing an optical resonator in a semiconductor laser device comprising the steps of:

embedding in an uncured resin a semiconductor laser structure having end-surfaces to be a resonator formed on a substrate and curing said resin to protect the structure;

lapping and polishing said end-surfaces and parts of said cured resin thereon;

forming thin films on the polished end-surfaces; and removing said cured resin.

2. A method as set forth in claim 1, wherein said end-surfaces are formed in such a manner that said semiconductor laser structure in which a laser light propagates is cut perpendicular to an extending direction of the propagation of the laser light by means of a cutting machine.

3. A method as set forth in claim 1, wherein said embedding step to protect the structure includes a piling process of piling a plurality of the substrates each having the same size while each semiconductor laser structures is embedded in said uncured resin.

4. A method for preparing an optical resonator in a semiconductor laser device comprising the steps of:

embedding in an uncured resin a semiconductor laser structure having end-surfaces to be a resonator formed on a substrate in such a manner that the substrate is put between a pair of dummy substrates having the same size as the substrate to be sandwiched therebetween;

curing said resin to protect the structure so as to make a piled lamination;

lapping and polishing said end-surfaces and parts of said cured resin thereon together with side surfaces of the dummy substrates in the piled lamination;

forming thin films on the polished end-surfaces; and removing said cured resin, and said dummy substrates.

5. A method as set forth in claim 4, wherein said end-surfaces are formed in such a manner that said semiconductor laser structure in which a laser light propagates is cut perpendicular to an extending direction of the propagation of the laser light by means of a cutting machine so as to make a pair of parallel end-surfaces.

6. A method as set forth in claim 4, wherein said embedding step to pile the substrates includes a piling process of piling a plurality of the substrates each having the same size while each semiconductor laser structures is embedded in said uncured resin and sandwiching the piled substrates between the pair of said dummy substrates.

* * * * *